United States Patent [19]
Houston

[11] Patent Number: 5,160,989
[45] Date of Patent: Nov. 3, 1992

[54] EXTENDED BODY CONTACT FOR SEMICONDUCTOR OVER INSULATOR TRANSISTOR

[75] Inventor: Theodore W. Houston, Dallas, Tex.

[73] Assignee: Texas Instruments Incorporated, Dallas, Tex.

[21] Appl. No.: 365,390

[22] Filed: Jun. 13, 1989

[51] Int. Cl.$^5$ .................... H01L 27/01; H01L 29/10
[52] U.S. Cl. ............................. 257/347; 257/901; 257/349
[58] Field of Search ............ 357/23.7, 4, 90, 67, 357/23.3, 86

[56] References Cited

U.S. PATENT DOCUMENTS

| | | | |
|---|---|---|---|
| 4,053,916 | 10/1977 | Cricchi et al. | 357/23 |
| 4,106,045 | 8/1978 | Nishi | 357/23.7 |
| 4,797,721 | 1/1989 | Hsu | 357/23.12 |
| 4,809,056 | 2/1989 | Shirato et al. | 357/71 |
| 4,899,202 | 2/1990 | Blake et al. | 357/23.7 |
| 4,969,023 | 11/1990 | Svedberg | 357/20 |

FOREIGN PATENT DOCUMENTS 59-220961 12/1984 Japan ................ 357/23.14

OTHER PUBLICATIONS

Tihanyi et al., "Properties of ESFI MOS Transistors Due to the Floating Substrate and the Finite Volume," *IEEE Trans. Elec. Dev.*, vol. ED-22, No. 11 (Nov. 1975), pp. 1017–1023.

Kumamoto et al., "An SOI Structure for Flash A/D Converter," *IEEE J. Sol. St. Circ.*, vol. 23, No. 1 (Feb. 1988), pp. 198–201.

Lee et al., "Island Edge Effects in C-MOS/SOS Transistors," *IEEE Trans. Elec. Dev.*, vol. ED-25, No. 8 (Aug. 1978), pp. 971–978.

Tihanyi et al., "Influence of the Floating Substrate Potential on the Characteristics of ESFI MOS Transistors," *Solid-State Electronics*, vol. 18, (Pergamon Press, 1975), pp. 309–314.

*Primary Examiner*—Mark V. Prenty
*Attorney, Agent, or Firm*—Ira S. Matsil; B. Peter Barndt; Richard L. Donaldson

[57] ABSTRACT

A semiconductor over insulator transistor is provided preferably of a lightly doped drain ("LDD") profile. LDD transistor (74) includes a semiconductor mesa (76) formed over an insulating layer (94) which overlies a semiconductor substrate (96). Semiconductor mesa (76) includes a source region (78) and a drain region (80) at opposite ends thereof. A body node (82) is disposed between source and drain regions (78,80). A low resistance contact region (98) lies along substantially the entire width of body region (82) and contacts a vertical contact which permits electrical contact from the top surface of semiconductor mesa (76) to low resistance contact region (98). Low resistance contact region (98) may be extended to fully underlie source region (78) such that the vertical contact may be moved away from body node (82).

44 Claims, 3 Drawing Sheets

EXTENDED BODY CONTACT FOR SEMICONDUCTOR OVER INSULATOR TRANSISTOR

This invention was made with Government support under contract No. DNA 001-86-C-0090 awarded by the Defense Nuclear Agency. The Government has certain rights in this invention.

TECHNICAL FIELD OF THE INVENTION

This invention relates to integrated circuits, and more particularly to voltage control of the body of a silicon over insulator transistor.

This application is related to applications Ser. No. 216,933 filed Jul. 8, 1988 and now U.S. Pat. No. 4,899,202, and Ser. No. 216,932 also filed Jul. 8, 1988 and now U.S. Pat. No. 4,965,213.

BACKGROUND OF THE INVENTION

Silicon on insulator ("SOI") technology deals with the formation of transistors in a layer of semiconductor material known as a mesa which overlies an insulating layer. The most common embodiment of SOI structures is a single crystal layer of silicon which overlies a layer of silicon dioxide. High performance and high density integrated circuits are achievable using SOI technology due to the reduction of parasitic elements as compared to non-SOI technology formed in bulk semiconductor. For example, for a MOS transistor formed in bulk, parasitic capacitance is present at the junction between the source/drain regions and the underlying substrate. Further, the possibility of breakdown of the junction exists between the source/drain regions and the substrate region. Still further, in CMOS technology in bulk, parasitic bipolar transistors are formed by N channel and P channel transistors in adjacent wells and can give rise to latch-up problems. SOI structures significantly alleviate the parasitic elements and increase junction breakdown tolerance. Thus, SOI technology is well suited for high performance and high density integrated circuits.

In bulk transistors, electrical connection is made via the substrate to the body node of a MOS transistor. The relatively fixed bias of the body node resulting from this connection provides for a stable threshold voltage relative to the drain-to-source voltage. Comparatively, conventional SOI transistors provide a body node which is electrically floating as the body node is isolated from the substrate by the underlying insulator. Under sufficient drain-to-source bias, impact ionization can generate electron hole pairs near the drain which, due to the majority carriers traveling to the body node while the minority carriers travel to the drain, cause a voltage differential between the body node and the source of the transistor. This voltage differential lowers the effective threshold voltage and increases the drain current, thereby exhibiting the well-known "kink" effect.

The floating body node of the SOI transistor also presents a parasitic back-channel transistor with the substrate as the gate and the insulator underlying the transistor as the gate dielectric. This back-channel may provide for a drain-to-source leakage path along the body node near the interface with the underlying insulator. In addition, the dielectrically isolated body node allows capacitive coupling between the body node and the gate and diode coupling between the body node and the source and drain. Either of these coupling effects may cause the body node to be biased and thus affect the threshold voltage of the SOI transistor. Each of these factors can contribute to undesirable performance shifts in the transistors relative to design, as well as to increased instability of the transistor operating characteristics.

In light of the aforesaid, it is thus desirable to fix the voltage of the body node rather than allowing it to float. Typically, the body node is kept at the same voltage as the source or may be controlled at a voltage different therefrom. In devices heretofore known, control of the body node voltage is effected by either contacting the body node directly at the edge of the transistor or, alternatively, providing a semiconductor contact region at the surface of the transistor which may be contacted to control the voltage of the body node. However, these existing techniques for contacting the body node provide accurate control voltage only at points immediately proximate the contact. The resistance to any point of the body node increases with distance away from the contact. Therefore, any current provided through the contact will cause a corresponding increase in voltage across the body node at distances away from the contact. As a result, a single contact does not provide a uniform voltage across the entire body node. A nonuniform voltage along the body node will degrade the operating characteristics of the transistor. The doping, and thus the conductivity of the body node, is limited by restrictions to obtain the desired transistor characteristics, such as threshold voltage.

Therefore, a need has arisen for a body node contact which may control the voltage bias to the body node of a SOI transistor in a uniform fashion across the entire length thereof. There also exists a need to uniformly control the body node voltage independent of the source voltage.

SUMMARY OF THE INVENTION

In accordance with the present invention, a semiconductor over insulator ("SOI") transistor is provided which includes a semiconductor mesa overlying an insulating layer. The semiconductor mesa has a source and a drain at its opposite ends, both being formed of a first conductivity type. A body region is formed within the mesa between the source and drain regions and is of a second conductivity type and a first dopant level. The semiconductor mesa further includes a low resistance contact region disposed along substantially the entire width of the body region between the source region and the body region and adjacent the underlying insulating layer. The low resistance contact region comprises a second conductivity type material and a second dopant level greater in dopant concentration than the first dopant level.

The present invention further includes a vertical contact region between the low resistance contact region and the top of the semiconductor mesa. This vertical contact region is of the second conductivity type and of a dopant level greater than or equal to the second dopant level. An ohmic contact may also be formed connecting the source region and the vertical contact region. Further, the low resistance contact region may extend under the source region to separate the source region from the insulating layer. Still further, the vertical contact region may be formed away from the body region. A segment region may be formed between the low contact region and the vertical contact region which is away from the body region. The present invention also includes both common and lightly doped drain SOI transistors.

The present invention provides the technical advantage of permitting more uniform control of the voltage bias of the SOI transistor body node. Another technical advantage is that the contact to the body node may be formed away from the body node, thereby allowing the body node voltage to be controlled from a location remote from the body node. Another technical advantage of the present invention is increased radiation hardness created by the addition of a highly doped area at the backgate of the transistor. This highly doped area effectively raises the threshold voltage for turning on the backgate.

BRIEF DESCRIPTION OF THE DRAWINGS

For a more complete understanding of the present invention and the advantages thereof, reference is now made to the following descriptions taken in conjunction with the accompanying drawings:

FIG. 2b illustrates a cross-sectional view of the SOI transistor of FIG. 2a;

DETAILED DESCRIPTION OF THE INVENTION

The preferred embodiment of the present invention is best understood by referring to FIGS. 1a–5 of the drawings, like numerals being used for like and corresponding parts of the various drawings.

Figure 1A:
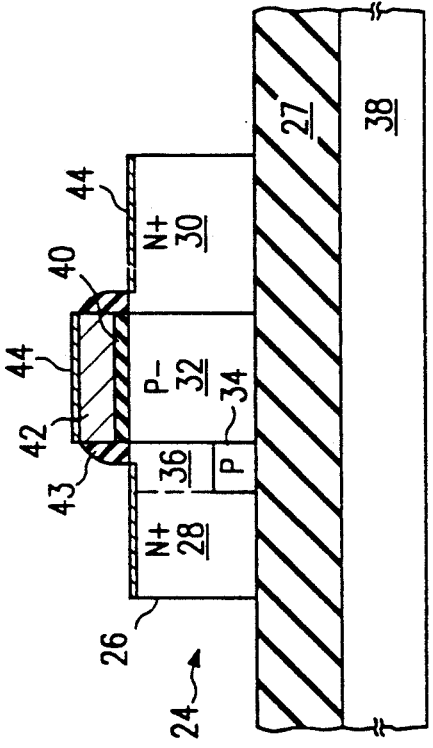
FIG. 1a illustrates a plan view of a prior art SOI transistor.

FIG. 1a illustrates a prior art semiconductor over insulator ("SOI") transistor denoted generally at 10. A semiconductor mesa 12 overlies an insulating region 13. Semiconductor mesa 12 has a source region 14 at one end and a drain region 16 at the other end thereof. A body region or body node 18 is disposed between the source and drain regions. Both source region 14 and drain region 16 are of the same conductivity type and are opposite that of body node 18. For example, in FIG. 1a, source and drain regions 14 and 16 are of an N type material while body node 18 is of a P type material. It is to be understood that these types of materials may be reversed such that source and drain regions 14 and 16 are of a P type material while body node 18 is of an N type material. Source and drain regions 14 and 16 are of a relatively high dopant concentration level, while body node 18 is of a relatively low dopant concentration. An "N+" or "P+" designation indicates a dopant concentration level equal to or greater than $10^{20}/cm^3$, while an "N−" or "P−" concentration indicates a level generally between $10^{14}/cm^3$ and $10^{17}/cm^3$. An intermediate level of doping is designated as simply "P" or "N" and indicates a dopant concentration level between $10^{18}/cm^3$ and $10^{19}/cm^3$. Typical dopants for N type materials includes arsenic, antimony and phosphorus. Typical dopants for P type materials include boron, gallium or aluminum.

A vertical contact region 20 is formed adjacent body node 18 to provide contact to body node 18 from the top of semiconductor mesa 12. Vertical contact region 20 is of the same semiconductor material type as body node 18, but is doped at a dopant concentration level greater than body node 18. Vertical contact region 20 is used to control the voltage of body node 18. It is thus apparent from FIG. 1a that by placing an ohmic contact at the surface of semiconductor mesa 12 which connects both source region 14 and vertical contact region 20, the source voltage will be transferred to body node 18 by virtue of vertical contact region 20.

Figure 1B:
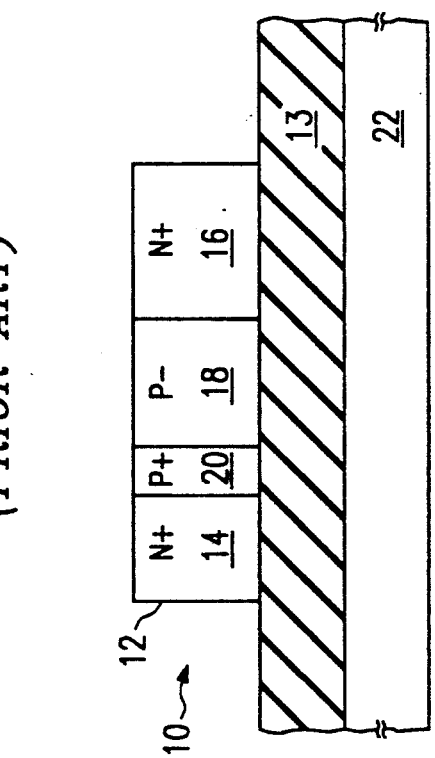
FIG. 1b illustrates a cross-sectional view of a prior art SOI transistor.

FIG. 1b illustrates a cross-sectional view of SOI transistor 10 of FIG. 1a. From this perspective, it may appreciated that semiconductor mesa 12 is formed over insulating layer 13. Insulating layer 13 overlies a semiconductor substrate 22. It may also be appreciated that vertical contact region 20, in addition to contacting body node 18, extends from the interface of semiconductor mesa 12 with insulating layer 13 to the top of semiconductor mesa 12. Where vertical contact region 20 is used to control the voltage level of body node 18, a voltage gradient occurs. In the area of body node 18 proximate vertical contact region 20, the voltage is well controlled. However, the width of body node 18 creates resistance in a direction away from vertical contact region 20. Therefore, if a current is provided to vertical contact region 20 to maintain the voltage in body node 18, a voltage gradient will be created which will increase at distances along the length of body node 18 in proportion to the distance away from vertical contact region 20. It is an object of the present invention to provide a more uniform voltage control across the entire width of body node 18.

Figure 2A:
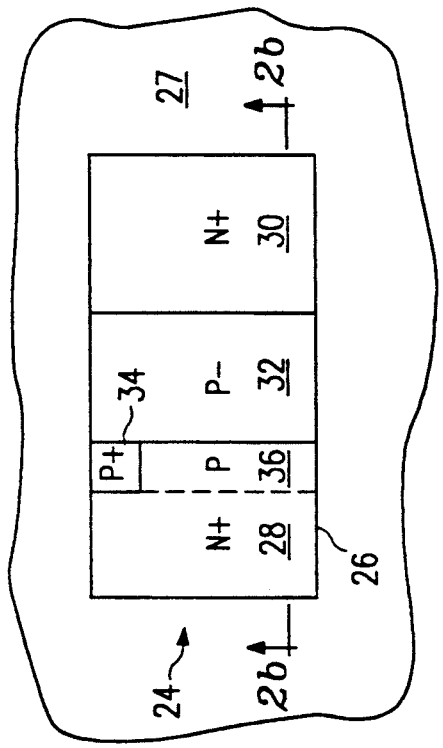
FIG. 2a illustrates a plan view of a SOI transistor having a low resistance contact region along the body node.

FIG. 2a illustrates a plan view of a SOI transistor 24 constructed according to the present invention. A semiconductor mesa 26, preferably made of silicon overlies an insulating layer 27. Insulating layer 27 is typically silicon dioxide formed on a semiconductor substrate (see 38, FIG. 2b). It should be noted that a similar technology to SOI is the silicon on sapphire ("SOS") technology. Sapphire is merely another type of insulator. SOS technology thus provides similar benefits as those discussed in connection with SOI technology above, and the present invention is applicable to SOS structures as well.

Semiconductor mesa 26 may be formed over insulating layer 27 by any one of a number of known methods such as SIMOX (Separation by IMplanted OXygen), oxidized porous silicon (FIPOS) and thin film zone-melting recrystallization (ZMR). Semiconductor mesa 26 has a source region 28 at one end thereof and a drain region 30 at the other. Source and drain regions 28 may be formed by ion implantation and subsequent diffusion. A body region or body node 32 is formed between source region 28 and drain region 30. The length of SOI transistor 24 is defined in the direction between source region 28 and drain region 30. Source and drain regions 28 and 30 are on the order of 2 μm in length or greater, while body node 32 is approximately 1 μm in length. Again, source and drain regions 28 and 30 are of opposite conductivity type than body node 32. Further, source and drain regions 28 and 30 are of a relatively high dopant concentration level, for example, in the range of $10^{20}$/cm (denoted "N+" or "P+") while body node 32 is of a relatively low dopant concentration level, for example, in the range from $10^{14}$/cm$^3$ to $10^{17}$/cm$^3$ (denoted "N−" or "P−").

It is to be understood that source and drain regions 28 and 30 need not necessarily be formed at the ends of semiconductor mesa 26. For example, a plurality of source/drain region pairs may be formed within a single semiconductor mesa. The body node, however, will remain as the region between the source and drain regions.

A vertical contact region 34 on the order of 1 μm in width is formed adjacent body node 32, and is of a like semiconductor material. However, vertical contact region 34 is of a higher dopant concentration level than body node 32. Typically, vertical contact region 34 is doped at a concentration of greater than or equal to $10^{20}$/cm$^3$ (i.e., "P+" or "N+"). Vertical contact region 34 may be formed by appropriately masking semiconductor mesa 26 and implanting the appropriate species through areas which are not masked. A low resistance contact region 36 on the order of 0.1–0.2 μm in width is disposed along body node 32. Low resistance contact region 36 is formed to have a resistivity of less than or about one-half of the resistivity of body node 32. For example, body node 32 may have a resistivity of approximately 1 to 3 KΩ-cm. Accordingly, the resistivity of low resistance contact region 32 will be less than 0.5 to 1 5 KΩ-cm.

As will be discussed later, low resistance contact region 36 is formed below the surface of mesa 26 and therefore is shown in phantom in FIG. 2a. It is to be understood that low resistance contact region 36 may extend fully along the entire width of body node 32 or substantially along the majority thereof. Low resistance contact region 36 is of the same semiconductor type as vertical contact region 34. However, the preferred resistivity of a low resistance contact region 36 is equal to or less than that of vertical contact region 34. Thus, the doping concentration of low resistance contact region 36 is typically on the order of $10^{18}$/cm$^3$ to $10^{19}$/cm$^3$ (i.e., "P" or "N"). For example, in FIG. 2a, low resistance contact region 36 is of a P material, while vertical contact region 34 may be either a P or a P+ material. It should be noted, however, that low resistance contact region 36 may be doped more heavily on the order of $10^{20}$/cm$^3$ or greater. Because vertical contact region 34 connects to low resistance contact region 36, and low resistance contact region 36 connects to body node 32, then a voltage applied to vertical contact region 34 will pass through these connections to bias body node 32. Further, the dopant concentration of low resistance contact region 36 ensures lower resistance along this path of contacts.

Figure 2B:
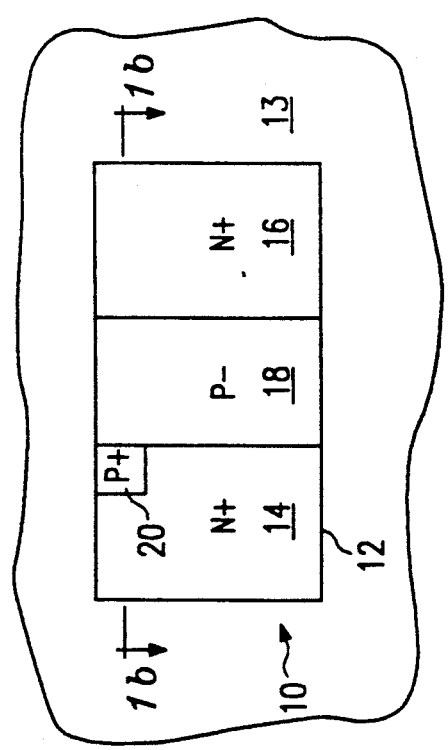

FIG. 2b illustrates a cross-sectional view of SOI transistor 24 of FIG. 2a. Semiconductor mesa 26 is approximately 0.3 μm in height. It is to be noted that the FIGURES herein are not drawn to scale, but rather are drawn to facilitate a more particular and distinctive description of the present invention. Low resistance contact region 36 is formed adjacent the interface between semiconductor mesa 26 and insulating layer 27. Further, low resistance contact region 36 does not extend to the top surface of semiconductor mesa 26, but rather extends only approximately one-half the height thereof. Thus, low resistance contact region is on the order of 0.15 μm in height. Low resistance contact region 36 may be formed by masking semiconductor mesa 26 and performing a deep ion implant. The particular energy level necessary for the deep implant will depend on both the desired depth and the particular species of ion being implanted.

From FIGS. 2a and 2b, it may be appreciated that low resistance contact region 36 couples with vertical contact region 34 such that a voltage applied to vertical contact region 34 will extend to low resistance contact region 36. The voltage across low resistance contact region 36 is applied uniformly across the entire width of body node 32 thereby enhancing the transistor operating characteristics. Therefore, the entire body node 32 may be subjected to a uniform control voltage. Further, the existence of low resistance contact region 36 increases the threshold voltage of the transistor near insulating layer 27. As a result, low resistance contact region 36 reduces the possibility of leakage by the back-gate transistor effect inherent to a SOI transistor.

It is also to be understood that a second low resistance contact region but without the vertical contact region could be formed symmetrically within the drain side of the SOI transistor. Thus, there would be a second low resistance contact region (not shown) along substantially all, or the entire width, of body node 32 between body region 32 and drain region 30, and adjacent insulating layer 27.

A gate insulator 40, such as thermally grown silicon dioxide, deposited silicon nitride, or a combination thereof, is disposed on the surface of semiconductor mesa 26 and above body node 32. Gate electrode 42, commonly formed of heavily doped polycrystalline silicon, overlies gate insulator 40 and defines the gate of the transistor. Insulating sidewall spacers 43 are formed adjacent gate electrode 42 and may provide isolation from subsequent silicide formation. A refractory metal silicide film 44, such as titanium disilicide, is shown as cladding source and drain regions 28 and 30, as well as gate electrode 42. Such silicidation is useful in reducing the sheet resistance of the semiconductor layers and preferably done according to the self-aligned direct react silicidation process. Such silicidation is not essential to the operation of the transistor. Any one of the well-known refractory metals conventionally used in silicidation such as molybdenum, tungsten and cobalt may alternatively be used for formation of silicide film 44. The silicide film 44 overlying source region 28 may be allowed to contact vertical contact region 34. This contact will electrically couple source region 28 to low resistance contact region 36 and consequently, to body node 32.

Figure 3A:
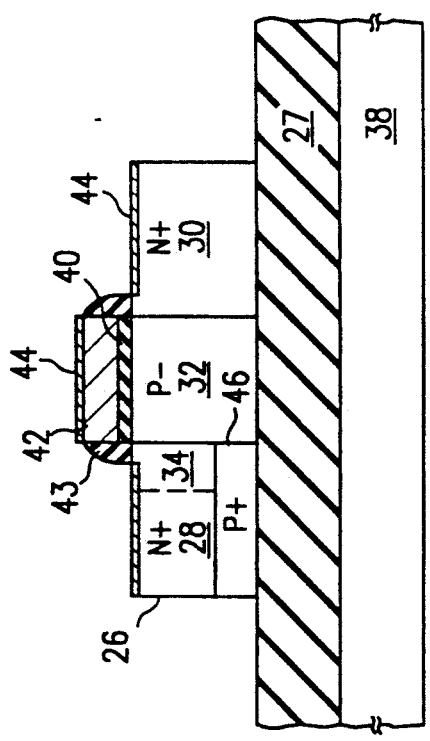
FIG. 3a illustrates a cross-sectional view of a SOI transistor having a low resistance contact region separating the source region from the underlying insulating layer.

FIG. 3a illustrates a cross-sectional view of an alternative embodiment of the present invention. The SOI transistor is constructed in substantially the same manner as that of FIG. 2b, with the exception that the low resistance contact region 36 of FIG. 2b has been extended under the complete source region 28 to form low resistance contact region 46. Low resistance contact region 46 separates source region 28 from insulating layer 27. Low resistance contact region 46 is again preferably doped on the order of $10^{18}$/cm$^3$ to $10^{19}/cm^3$ in order to provide minimal resistance to the control voltage for body node 32. The high doping concentration should provide a resistivity of less than about one-half of the resistivity of body node 32. The doping may be raised further to $10^{20}/cm^3$ or greater to further reduce the resistivity of low resistance contact region 46.

There are numerous benefits in extending low resistance contact region 46 completely under source region 28. For example, vertical contact region 34 need not be formed adjacent body node 32, but rather, may be formed away from body node 32 while still remaining in contact with low resistance contact region 46. Thus, vertical contact region 34 may be moved to any location proximate body node 32 so long as it remains in contact with low resistance contact region 46.

Figure 3B:
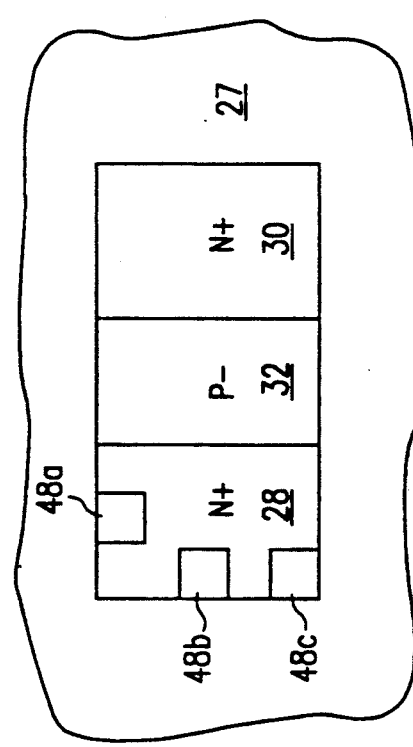
FIG. 3b illustrates a plan view of a SOI transistor having various vertical contact regions disposed away from the body node thereof.

FIG. 3b illustrates a plan view of three different locations for a vertical contact region indicated at 48a, 48b and 48c, whereby the vertical contact region is moved away from body node 32 while remaining in contact with the underlying low resistance contact region 46. It will be understood that locations 48a-c could be formed at any other suitable locations away from body node 32. The vertical contact may be formed at any such location by appropriately masking the mesa surface prior to the implantation of the vertical contact region. It should be noted that for all three locations of the vertical contact, source region 28 is in contact with the full width of body node 32. This is beneficial in that it permits maximum transistor effect between source and drain regions 28 and 30 through body node 32. In the prior art, the vertical contact region necessarily contacted the body node and therefore there was not complete contact between source and body over the entire width of the body node. This effectively reduced the width of the source region, thereby diminishing the lateral transistor effect between the source and drain regions through the added length of opposite type semiconductor material provided by the vertical contact region. Conversely, if the vertical contact region is moved away from body node 32, this degradation of transistor effect is eliminated.

The vertical contacts of FIG. 3b also give rise to another benefit provided by the present invention. A silicide film such as that discussed in connection with FIG. 2b may once again be formed over source region 28 to electrically connect it to body node 32. Alternatively, an ohmic contact independent of source region 32 may be made to a contact region 48a, 48b or 48c so that the voltage of body node 32 may be controlled independently of the voltage of source region 28. Thus, source region 28 could be held at a first voltage level while body node 32 was held at a second, independent voltage level.

Figure 4:
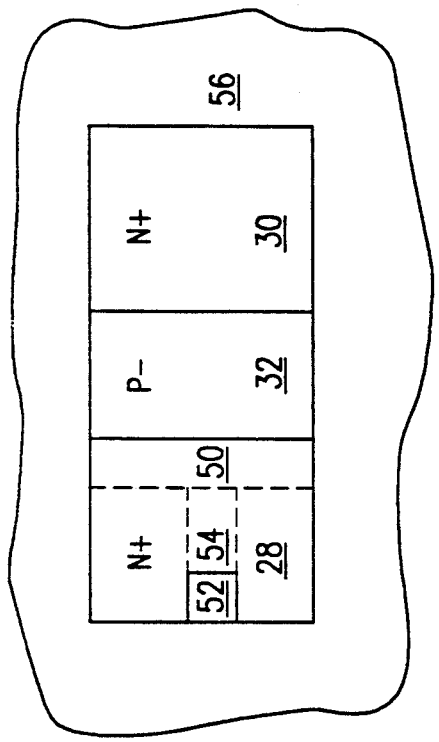
FIG. 4 illustrates a plan view of a SOI transistor having a low resistance contact region along the body node and a segment region connecting the low resistance contact region to a vertical contact region.

FIG. 4 illustrates a plan view of another embodiment of the present invention. A low resistance contact region 50 is again formed along either substantially all, or the entire width, of body node 32. Low resistance contact region 50 is formed in the same manner as discussed in connection with low resistance contact region 36 of FIG. 2a. Further, a vertical contact region 52 is formed at a distance away from body node 32. It should be noted that vertical contact region 52 need not be placed in the location as shown, but may be set in any arbitrary location away from body node 32 as discussed in reference to FIG. 3b above. A segment region 54 is formed between low resistance contact region 50 and vertical contact region 52. Segment region 54 comprises the same type of semiconductor material as vertical contact region 52, and a dopant concentration of either intermediate level doping from $10^{18}/cm^3$ to $10^{19}/cm^3$, or high doping at or greater than $10^{20}/cm^3$. Segment region 54 lies adjacent the underlying insulating layer 56 in a manner similar to that discussed in reference to low resistance contact region 46 of FIG. 3a. Segment region 54 is formed in a manner similar to low resistance contact region 50 but preferably of a dopant concentration equal or greater than low resistance contact region 50.

It is to be understood that segment region 54 may be used at any location between vertical contact region 52 and low resistance contact region 50 while remaining substantially adjacent to insulating layer 56. The use of segment region 54 in lieu of low resistance contact region 46 of FIG. 3a gives rise to various considerations. An additional mask is necessary for the former which is not required for the latter. However, segment 54 has less junction area between itself and source region 28. Reduced junction area minimizes problems arising from both photocollection and single event upset which occur when body node 32 and source region 28 are maintained at different voltage levels. Therefore, there are clear advantages in having the lesser junction area provided by segment 54.

Figure 5:
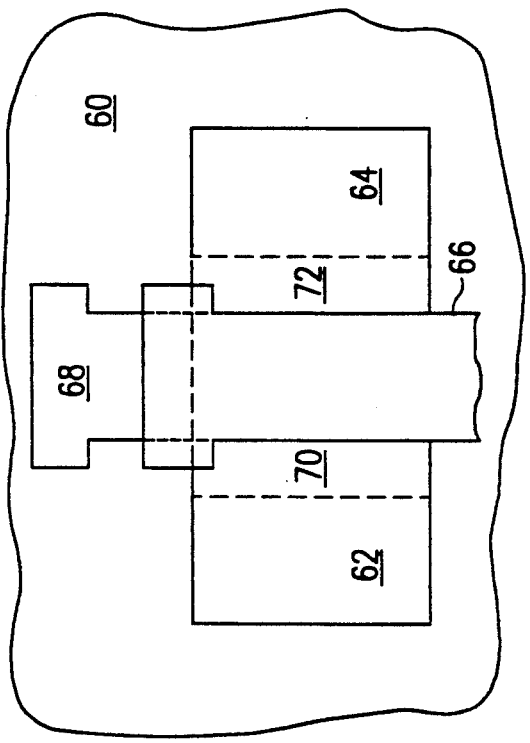
FIG. 5 illustrates a plan view of another embodiment of the present invention.

FIG. 5 illustrates a plan view of another embodiment of the present invention. Again, a semiconductor mesa 58 overlies an insulating layer 60, which in turn overlies a semiconductor substrate (not shown). Semiconductor mesa 58 has a source region 62 at one end thereof and a drain region 64 at the other. A body node is formed between source region 62 and drain region 64. From the plan view of FIG. 5, the body node is not perceptible because gate electrode 66 overlies the body node. However, it is to be understood that the body node is self-aligned and under gate electrode 66. Gate electrode 66 is typically polysilicon and is on the order of 1 $\mu$m in length. A body node edge contact 68 is formed planar with semiconductor mesa 58 and extends outward therefrom while contacting semiconductor mesa 58 at the body node. The extension of edge contact 68 is on the order of 2-3 $\mu$m from semiconductor mesa 58. Edge contact 68 provides a means by which electrical contact may be made to the body node without the necessity of a vertical contact as discussed above. Thus, an electrical voltage applied to edge contact 68 will connect to bias the adjacent body node.

As in the embodiments discussed above, a low resistance contact region 70 is formed along substantially all, or the entire width of the body node and contacting source region 62 and the body node. Low resistance contact region 70 is again formed of a resistivity of about-one-half that of the body node. The device may include a single low resistance contact region 70, or may have an additional second low resistance contact region 72. Low resistance contact region 72 may be formed along substantially all, or the entire width of the body node and contacting drain region 64 and the body node. First and second low resistance contact regions 70 and 72 in this embodiment may be used both for biasing the body node and reducing backgate transistor effects as discussed in reference to the aforementioned embodiments herein.

Edge contact 68 may be formed to contact solely the body node, or additionally, one or two low resistance contact regions 70 and 72. Thus, there are numerous possible variations of the embodiment of FIG. 5, including one or two low resistance contact regions 70 and 72, with edge contact 68 contacting either one or both of those regions, or contacting solely the body node. In any of these variations, either a single or both contact regions 70 and 72 will act to distribute the voltage from edge contact 68 along the body node. Where edge contact 68 contacts only the body node, there will be a slight series resistance from edge contact 68 to the low resistance contact region or regions. Where edge contact 68 directly contacts the low resistance contact region(s), this series resistance is eliminated. In either case, the low resistance contact region(s) will act as a resistance in parallel with the body node, and therefore will distribute the voltage across thereacross.

Figure 6:
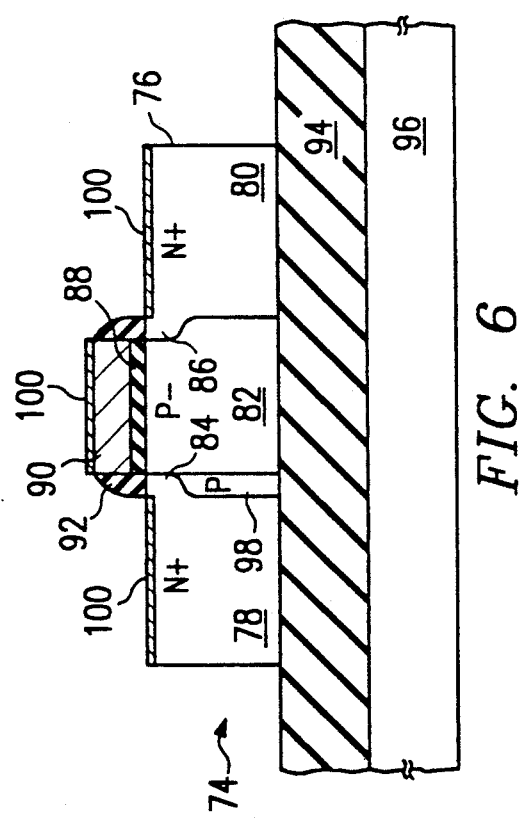
FIG. 6 illustrates a cross-sectional view of the preferred SOI transistor in a lightly doped drain profile and having a low resistance contact region along the body node.

FIG. 6 illustrates a cross-sectional view of the preferred embodiment of the present invention. A conventional transistor 74 is formed according to the lightly doped drain ("LDD") construction. The transistor includes a mesa 76 having a source region 78, a drain region 80 and a body node 82 therebetween. Unlike the typical bulk transistor, however, LDD transistor 74 includes lightly doped regions 84 and 86. A gate insulator 88 and gate conductor 90 overlie body node 82. Gate conductor 90 further includes sidewall spacers 92 at both edges thereof. LDD transistor 74 is formed over an insulating layer 94 which itself overlies a semiconductor substrate 96. A low resistance contact region 98 runs along the entire width, or substantially the entire width, of body node 82 between source region 78 and body node 82 and adjacent insulating layer 94. Further, as a result of the LDD profile, low resistance contact region 98 extends vertically between lightly doped region 84 and insulating layer 94. A vertical contact region (not shown) may again be formed to contact low resistance contact region 98 and extend to the top of source region 78. Silicided film 100 is formed over source and drain regions 78 and 80, and also over gate conductor 90.

LDD transistor 74 is formed with the implantation of the lightly doped regions 84 and 86 performed in a self-aligned manner to gate electrode 90 and generally prior to formation of sidewalls spacers 92. An example of the method for forming LDD transistors by use of a sidewall spacer is described in U.S. Pat. No. 4,356,623, issued Nov. 2, 1982, assigned to Texas Instruments Inc. and is incorporated herein by reference. The heavily doped portions of source and drain regions 78 and 80 are formed in a self-aligned fashion relative to gate electrode 90 and sidewall spacers 92. Generally, source and drain regions 78 and 80 extend from the top surface of semiconductor mesa 76 to insulating layer 94. However, low resistance contact region 98 may prevent source region 78 from completely contacting insulating layer 94. Further, if low resistance contact regions are formed within both source region 78 and drain region 80 as mentioned above, then drain region 80 may also be prevented from contacting insulating layer 94.

It is to be understood that all previous embodiments and methods of fabrication thereof discussed hereinabove in reference to FIGS. 2a through and including FIG. 5 may be utilized with the LDD transistor 74 depicted in FIG. 6. Thus, low resistance contact region 98 may be extended completely under source region 78 in order to separate source region 78 from insulating layer 94. Further, the vertical contact may be moved away from body node 82 at any distant location adjacent source region 78. Still further, a segment may be used to connect low resistance contact region 98 to the vertical contact.

The present invention thus includes either a conventional or LDD transistor having a low resistance contact region along substantially the entire width, or the entire width, of the body node, between the source region and the body node and adjacent the underlying insulating layer. A vertical contact may be used to electrically connect the low resistance contact region to the upper surface of the semiconductor mesa. This vertical contact may be adjacent or moved away from the body node of the transistor. The low resistance contact region may be extended fully under the source region in order to contact a vertical contact disposed away from the body node or alternatively, a segment portion may be used for such contacting purposes. The surface of the source region may be completely silicided in order to electrically couple the source and body node regions. Alternatively, the silicide formed on the source may be patterned such that the vertical contact is isolated therefrom, thereby providing a second contact such that the voltage of the body node may be controlled independent of the voltage of the source region. An edge contact may also be used to bias the transistor body node, and may contact one or two low resistance contact regions adjacent the body node.

Although the present invention has been described in detail, it should be understood that various changes, substitutions and alterations can be made herein without departing from the spirit and scope of the invention as defined by the appended claims. Further, although the particular embodiments described herein are primarily in reference to the source side of the transistor, they may be equally formed either alternatively or additionally within the drain side of the transistor. Still further, the dimensions and doping levels given herein are merely by way of example and are not intended to be restrictive.

What is claimed is:

1. A transistor, comprising:
an insulating layer;
a semiconductor mesa having a base adjacent said insulating layer and a top opposite said base, said semiconductor mesa comprising:
a source region within said semiconductor mesa, said source region of a first conductivity type;
a drain region within said semiconductor mesa, said drain region of said first conductivity type;
a body region in contact with said insulating layer and extending to the top of said mesa and located between said source and drain regions, said body region of a second conductivity type and of a first dopant level;
a first contact region of resistivity lower than that of said body region disposed along substantially the entire width of said body region and adjacent said source region and said body region, said first contact region in contact with said insulating layer and underlying at least a portion of said source region and extending substantially no farther toward said body region than the junction between said source region and said body region;
a segment region between said source region and said insulating layer, and further contacting said first contact region; and
a vertical contact region adjoining said segment region and extending toward said top of said semiconductor mesa.

2. The transistor of claim 1 wherein said vertical contact region is of said second conductivity type and of second dopant level greater in dopant concentration than said first dopant level.

3. The transistor of claim 1 wherein said segment region is of said second conductivity type and of a second dopant level greater in concentration than said first dopant level.

4. The transistor of claim 1 wherein said transistor is a lightly doped drain transistor.

5. A transistor, comprising:
   an insulating layer;
   a semiconductor mesa having a base adjacent said insulating layer, said semiconductor mesa comprising:
   a source region within said semiconductor mesa, said source region of a first conductivity type and having a dopant concentration equal to or greater than $10^{20}/cm^3$;
   a drain region within said semiconductor mesa, said drain region of said first conductivity type and having a dopant concentration equal to or greater than $10^{20}/cm^3$;
   a body region between said source and drain regions, said body region of a second conductivity type and having a first dopant level of between about $10^{14}/cm^3$ and about $10^{17}/cm^7$ and;
   a first contact region of said second conductivity type and having a dopant level of between about $10^{18}/cm^3$ and about $10^{19}/cm^3$ such that said first contact region has a resistivity lower than that of said body region, said first contact region disposed along substantially the entire width of said body region and between said source region and said body region.

6. The transistor of claim 5 and further comprising a second contact region of resistivity lower than that of said body region disposed along substantially the entire width of said body region and adjacent said drain region and said body region and said insulating layer.

7. The transistor of claim 6 wherein said semiconductor mesa has a top opposite said base and said first contact region is disposed adjacent said insulating layer and has an upper surface below said mesa top, and further comprising a vertical contact region adjoining said first contact region and extending away from said upper surface and toward said top of said semiconductor mesa.

8. The transistor of claim 7 wherein said vertical contact region is of said second conductivity type and has a dopant level greater than the first dopant level of said body region.

9. The transistor of claim 8 and further comprising an ohmic contact connecting said source region and said vertical contact region.

10. The transistor of claim 9 wherein said ohmic contact comprises a silicide contact.

11. The transistor of claim 5 wherein said first contact region fully separates said source region from said insulating layer.

12. The transistor of claim 11 wherein said semiconductor mesa has a top opposite said base, and further comprising a vertical contact region away from said body region and adjoining said first contact region and extending toward said top of said semiconductor mesa.

13. The transistor of claim 12 wherein said vertical contact region is of said second conductivity type and has a dopant level greater than the dopant level of said body region.

14. The transistor of claim 5 wherein said semiconductor mesa has a top opposite said base, and further comprising:
   a segment region adjacent said source region and said insulating layer, and further contacting said first contact region; and
   a vertical contact region adjoining said segment region and extending toward said top of said semiconductor mesa.

15. The transistor of claim 14 wherein said vertical contact region is of said second conductivity type and has a dopant level greater than the dopant level of said body region.

16. The transistor of claim 14 wherein said segment region is of said second conductivity type and a dopant level greater than the dopant level of said body region.

17. The transistor of claim 5 and further comprising a gate conductor adjacent said body region.

18. The transistor of claim 17 and further comprising an insulating layer between said gate conductor and said body region.

19. The transistor of claim 5 and further comprising an edge contact adjacent and connected to said body region.

20. The transistor of claim 19 wherein said edge contact further contacts said first contact region.

21. The transistor of claim 19 and further comprising a second contact region of resistivity lower than that of said body region disposed along substantially the entire width of said body region and adjacent said drain region, said body region and said insulating layer.

22. The transistor of claim 21 wherein said edge contact further contacts said first and second contact regions.

23. A semiconductor over insulator transistor, comprising:
   an insulating layer;
   a semiconductor mesa having a base adjacent said insulating layer and a top opposite said base, and having first and second ends, said semiconductor mesa comprising:
   a source region at said first end of said semiconductor mesa, said source region of a first conductivity type and having a dopant concentration equal to or greater than $10^{20}/cm^3$;
   a drain region at said second end of said semiconductor mesa, said drain region of said first conductivity type and having a dopant concentration equal to or greater than $10^{20}/cm^3$;
   a body region between said source and drain regions, said body region of a second conductivity type and of a first dopant level of between $10^{14}/cm^3$ and about $10^{17}/cm^3$;
   a first contact region of said second conductivity type and having a dopant level of between about $10^{18}/cm^3$ and about $10^{19}/cm^3$ such that said first contact region has a resistivity lower than that of said body region, said first contact region disposed along substantially the entire width of said body region and between said source region and said body region such that voltage applied to said first contact region will be more uniformly distributed across said body region, said first contact region being of said second conductivity type and of a second dopant level greater in dopant concentration than said first dopant level; and a vertical contact region connecting said first contact region and said top of said semiconductor mesa, said vertical contact region being of said second conductivity type and a dopant level greater in dopant concentration than said first dopant level of said body region.

24. The semiconductor over insulator transistor of claim 23 and further comprising a second contact region of resistivity lower than that of said body region disposed along substantially the entire width of said body region and adjacent said drain region and said body region, said second contact region being of said second conductivity type and said second dopant level.

25. The semiconductor over insulator transistor of claim 23 and further comprising a silicide region connecting said source region and said vertical contact region.

26. The semiconductor over insulator transistor of claim 23 wherein said first contact region extends fully between said source region and said insulating layer such that said source region is separated from said insulating layer.

27. The semiconductor over insulator transistor of claim 26 wherein said vertical contact region between said first contact region and said top of said semiconductor mesa is away from said body region.

28. The semiconductor over insulator transistor of claim 23 and further comprising a segment region of said second conductivity type and a dopant level greater than said body region, said segment region adjacent said source region and said insulating layer, and further connecting said vertical contact region to said first contact region.

29. A transistor, comprising:
an insulating layer;
a semiconductor mesa having a base adjacent said insulating layer and a top opposite said base, said semiconductor mesa comprising:
a source region within said semiconductor mesa, said source region of a first conductivity type;
a drain region within said semiconductor mesa, said drain region of said first conductivity type;
a body region between said source and drain regions, said body region of a second conductivity type and of a first dopant level;
a first contact region of resistivity lower than that of said body region disposed along substantially the entire width of said body region and between said source region and said body region;

a segment region adjacent said source region and said insulating layer, and further contacting said first contact region; and a vertical contact region adjoining said segment region and extending toward said top of said semiconductor mesa.

30. The transistor of claim 1 wherein said first contact region is of said second conductivity type and of a second dopant level greater in dopant concentration than said first dopant level.

31. The transistor of claim 5 and further comprising a second contact region of resistivity lower than that of said body region disposed along substantially the entire width of said body region and adjacent said drain region, said body region and said insulating layer.

32. The transistor of claim 31 wherein said second contact region is of said second conductivity type and of a second dopant level greater in dopant concentration than said first dopant level.

33. The transistor of claim 23 and further comprising an ohmic contact connecting said source region and said vertical contact region.

34. The transistor of claim 33 wherein said ohmic contact comprises a silicide contact.

35. The transistor of claim 5 wherein said first contact region fully separates said source region from said insulating layer.

36. The transistor of claim 35 wherein said vertical contact region is spaced from said body region.

37. The transistor of claim 36 wherein said vertical contact region is of said second conductivity type and of a second dopant level greater in dopant concentration than said first dopant level.

38. The transistor of claim 5 wherein said transistor is a lightly doped drain transistor.

39. The transistor of claim 5 and further comprising a gate conductor adjacent said body region.

40. The transistor of claim 39 and further comprising an insulating layer between said gate conductor and said body region.

41. The transistor of claim 5 and further comprising an edge contact adjacent and connected to said body region.

42. The transistor of claim 41 wherein said edge contact further contacts said first contact region.

43. The transistor of claim 41 and further comprising a second contact region of resistivity lower than that of said body region disposed along substantially the entire width of said body region and adjacent said drain region, said body region and said insulating layer.

44. The transistor of claim 43 wherein said edge contact further contacts said first and second contact regions.

* * * * *